US008796776B2

United States Patent
Ho

(10) Patent No.: US 8,796,776 B2
(45) Date of Patent: Aug. 5, 2014

(54) PROTECTION COMPONENT AND ELECTROSTATIC DISCHARGE PROTECTION DEVICE WITH THE SAME

(75) Inventor: Yung-Hang Ho, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 77 days.

(21) Appl. No.: 13/494,736

(22) Filed: Jun. 12, 2012

(65) Prior Publication Data

US 2013/0328125 A1  Dec. 12, 2013

(51) Int. Cl.
*H01L 27/02* (2006.01)
*H03K 19/003* (2006.01)

(52) U.S. Cl.
CPC ...... *H01L 27/0285* (2013.01); *H03K 19/00315* (2013.01)
USPC ............................ 257/355; 257/173; 257/328

(58) Field of Classification Search
CPC ........... H01L 27/0266; H01L 27/0285; H03K 19/003; H03K 19/00315
USPC .......................................... 257/173, 328, 355
See application file for complete search history.

(56) References Cited

U.S. PATENT DOCUMENTS

| 5,182,220 | A | * | 1/1993 | Ker et al. | 438/200 |
| 5,455,436 | A | * | 10/1995 | Cheng | 257/356 |
| 5,591,992 | A | * | 1/1997 | Leach | 257/173 |
| 5,623,156 | A | * | 4/1997 | Watt | 257/355 |
| 6,538,266 | B2 | * | 3/2003 | Lee et al. | 257/173 |
| 7,368,761 | B1 | * | 5/2008 | Lai et al. | 257/173 |
| 8,017,471 | B2 | * | 9/2011 | Chapman et al. | 438/221 |
| 8,450,177 | B2 | * | 5/2013 | Marchant et al. | 438/268 |
| 2005/0051849 | A1 | * | 3/2005 | Shimotsusa | 257/368 |
| 2010/0078724 | A1 | * | 4/2010 | Imoto et al. | 257/355 |

* cited by examiner

*Primary Examiner* — Allan R Wilson
(74) *Attorney, Agent, or Firm* — J.C. Patents

(57) ABSTRACT

An electrostatic discharge protection device includes a protection component and a component controller. The protection component includes a first and a second P-type wells which are disposed in an N-type deep well, a first N-type transistor which is formed in the N-type deep well and the first P-type well, and a second N-type transistor which is formed in the N-type deep well and the second P-type well. When an electrostatic pulse occurs at a first pad or a second pad, the component controller turns on one of the first and the second N-type transistors to discharge the electrostatic pulse. When a first and a second operating signals are supplied to the first and the second pads, the component controller turns off the first and the second N-type transistors according to the first and the second operating signals so that the protection component is incapable of generating the current path.

25 Claims, 7 Drawing Sheets

PROTECTION COMPONENT AND ELECTROSTATIC DISCHARGE PROTECTION DEVICE WITH THE SAME

BACKGROUND OF THE DISCLOSURE

1. Technical Field

The disclosure generally relates to a protection component and an electrostatic discharge protection device with the same, and more particularly, to an electrostatic discharge protection component with N-type transistors and an electrostatic discharge protection device with the same.

2. Description of Related Art

For preventing the damages caused by the electrostatic discharge (ESD), an electrostatic discharge protection circuit is usually implemented in the integrated circuit. Furthermore, the silicon controlled rectifier (SCR) is a common protection component and widely applied in various ESD protection devices.

A dual direction SCR is a SCR that can be triggered in dual direction. Certain integrated circuits require to process positive input signal and negative input signal, so the dual direction SCR is utilized as a fundamental component in the ESD device design to help to meet the system requirements.

However, as most of the SCR, in the operation of the dual direction SCR, the turn on speed is often not fast enough, thus results in affecting the protection function of the ESD protection device. Therefore, various manufacturers are committed to improve the problem described above in order to enhance the protection function of the ESD protection device.

SUMMARY OF THE DISCLOSURE

Accordingly, an embodiment of the invention provides a protection component, which can control the on-off state of the internal N-type transistors according to a voltage level of the control terminals to enhance the turn on speed.

Another embodiment of the invention provides an electrostatic discharge (ESD) protection device, which enhances the protection function of the ESD protection device through controlling the on-off state of the N-type transistors of the protection component.

An embodiment of the invention provides a protection component. The protection component includes a P-type substrate, a first N-type transistor, and a second N-type transistor. Wherein, the P-type substrate includes an N-type deep well, a first P-type well, and a second P-type well, and the first P-type well and the second P-type well are disposed in the N-type deep well. The first N-type transistor is formed in the N-type deep well and the first P-type well. The second N-type transistor is formed in the N-type deep well and the second P-type well.

According to an embodiment of the invention, the protection component has a first connection terminal, a second connection terminal, a first control terminal, a second control terminal, and a third control terminal. And, a first drain/source of the first N-type transistor and a first drain/source of the second N-type transistor are electrically connected to the first control terminal, a second drain/source of the first N-type transistor and a second drain/source of the second N-type transistor are electrically connected to the first connection terminal and the second connection terminal respectively, and gates of the first N-type transistor and the second N-type transistor are electrically connected to the second control terminal and the third control terminal respectively.

Another embodiment of the invention provides an electrostatic discharge protection device, which is electrically connected to a first pad and a second pad, and includes the above-mentioned protection component and a component controller. The protection component is electrically connected to the first pad and the second pad through the first connection terminal and the second connection terminal, and the component controller is electrically connected to the first through the third control terminals. When an electrostatic pulse occurs at the first pad or the second pad, the component controller turns on one of the first N-type transistor and the second N-type transistor to discharge the electrostatic pulse through a current path of the protection component. When a first operating signal and a second operating signal are supplied to the first pad and the second pad, the component controller turns off the first N-type transistor and the second N-type transistor according to the first operating signal and the second operating signal so that the protection component is incapable of generating the current path.

According to an embodiment of the invention, when the electrostatic pulse occurs at the first pad, the component controller guides the electrostatic pulse to the first control terminal, and the component controller turns on the second N-type transistor and turn off the first N-type transistor.

According to an embodiment of the invention, the component controller further guides the electrostatic pulse to the third control terminal and pulls down a voltage level of the second control terminal to a ground voltage.

According to an embodiment of the invention, the component controller includes a first select circuit and a first control circuit. Wherein, the first select circuit is electrically connected to the first pad, the second pad, and the first control terminal. Furthermore, the first select circuit selects a high level signal among signals coming from the first pad and the second pad, and then output the high level signal to the first control terminal. The first control circuit is electrically connected to the first pad, the second pad, the second control terminal, and the third control terminal. Furthermore, the first control circuit adjusts voltage levels of the second control terminal and the third control terminal according to frequencies of the signals coming from the first pad and the second pad.

According to an embodiment of the invention, the component controller previously mentioned further guides the electrostatic pulse to the second control terminal and the third control terminal.

Based on the description above, the protection component controls the on-off state of the internal N-type transistors to enhance the turn on speed thereof.

Furthermore, the ESD protection device controls the on-off state of the N-type transistors of the protection component to increase the turn on speed of the protection component or prevent the formation of the current path of the protection component.

It is to be understood that both the foregoing general description and the following detailed description are exemplary, and are not intended to limit the scope of the invention.

BRIEF DESCRIPTION OF THE DRAWING

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
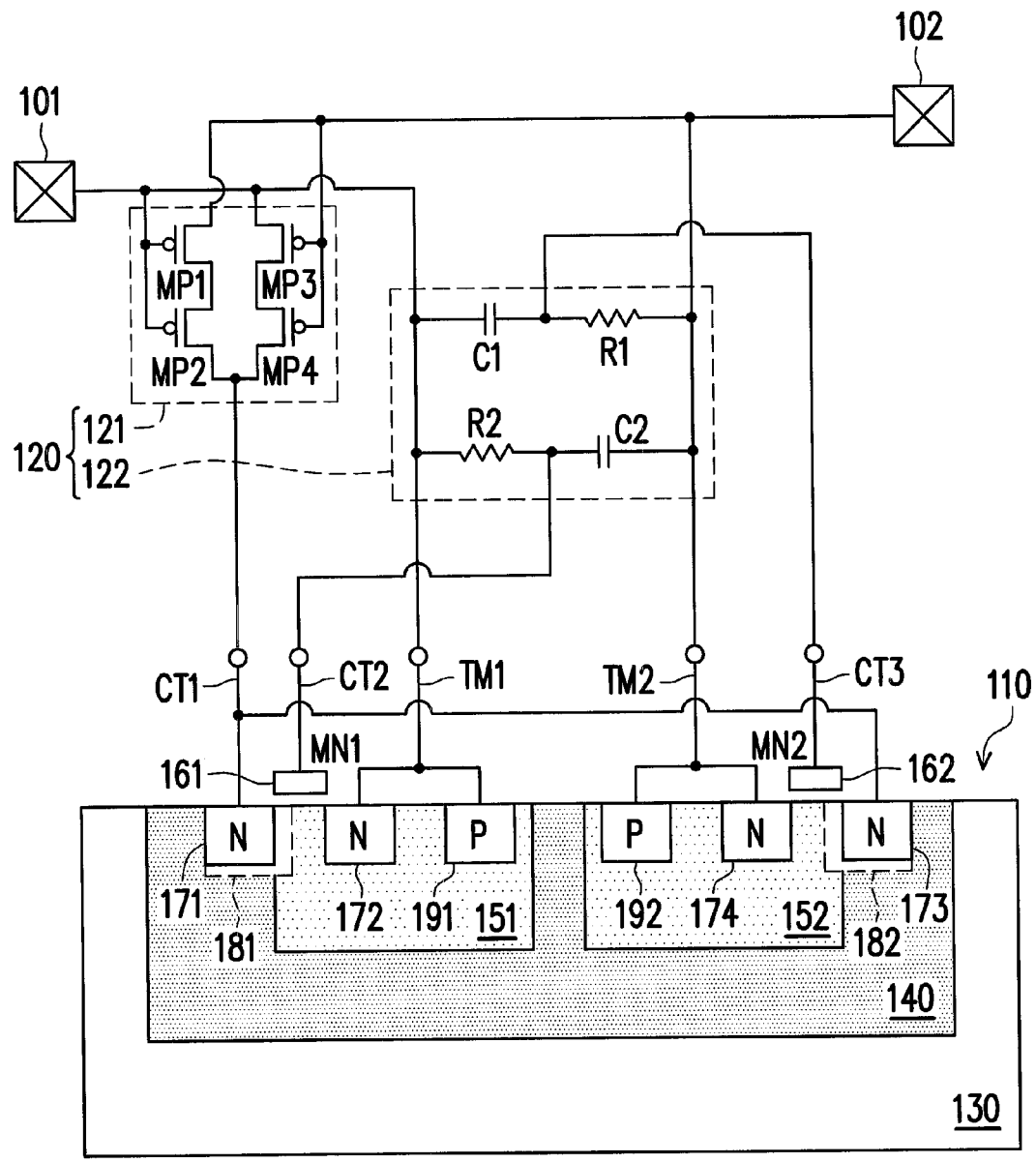
FIG. 1 is a schematic diagram illustrating an electrostatic discharge (ESD) protection device according to an embodiment of the disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram illustrating an electrostatic discharge protection device according to an embodiment of the disclosure. Referring to FIG. 1, the electrostatic discharge (ESD) protection device is suitable for being electrically connected to a first pad 101 and a second pad 102, and the electrostatic discharge protection device includes protection component 110 and component controller 120.

In view of the protection component, the protection component 110 includes a P-type substrate 130, an N-type deep well 140, a P-type well 151, a P-type well 152, an N-type transistor MN1, and an N-type transistor MN2. Wherein, the N-type deep well 140 is disposed in the P-type substrate 130, and the P-type wells 151 and 152 are disposed in the N-type deep well. Furthermore, the N-type transistor MN1 is formed in the N-type deep well 140 and the P-type well 151, and the N-type transistor MN2 is formed in the N-type deep well 140 and the P-type well 152.

The N-type transistor MN1 includes a gate structure 161, an N-type doped region 171, and an N-type doped region 172, wherein the gate structure 161 is disposed on the P-type well 151 and used to form a gate of N-type transistor MN1. In an exemplary embodiment, for example, the gate structure 161 can be composed of a gate dielectric layer and a gate conductive layer. Furthermore, the gate structure 161 is adjacent to a side wall of the P-type well 151, and the N-type doped region 171 and 172 are respectively located at the two sides of the gate structure 161. Therefore, in the configuration, the N-type doped region 171 is disposed in the N-type deep well 140 and connected to the adjacent P-type well 151. The N-type doped region 172 is disposed in the P-type well 151. Accordingly, a first drain/source and a second drain/source of the N-type transistor MN1 are formed respectively by the N-type doped region 171 and 172.

Similarly, the N-type transistor MN2 includes a gate structure 162, an N-type doped region 173 and an N-type doped region 174. Wherein, the gate structure 162 is disposed on the P-type well 152 and used to form a gate of the N-type transistor MN2. In an exemplary embodiment, for example, the gate structure 162 can be composed of a gate dielectric layer and a gate conductive layer. Furthermore, the gate structure 162 is adjacent to a side wall of the P-type well 152, and the N-type doped regions 173 and 174 are located at two sides of the gate structure 162. Therefore, in the configuration, the N-type doped region 173 is disposed in the N-type deep well 140 and connected to the adjacent P-type well 152. The N-type doped region 174 is disposed in the P-type well 152. Accordingly, a first drain/source and a second drain/source of the N-type transistor MN2 are formed respectively by the N-type doped regions 173 and 174.

Furthermore, in an exemplary embodiment, the N-type transistor MN1 further includes an N-type lightly doped region 181, and the N-type transistor MN2 further includes an N-type lightly doped region 182. Wherein, the N-type lightly doped region 181 is disposed in the P-type well 151 below the gate structure 161, and surrounds the N-type doped region 171. Furthermore, the N-type lightly doped region 182 is disposed in the P-type well 152 below the gate structure 162, and surrounds the N-type doped region 173. Accordingly, the protection component 110 utilizes the N-type lightly doped regions 181 and 182 to enhance the ability to withstand high voltage for the applications in the high voltage Integrated Circuit (IC). On other hands, the protection component 110 further includes a P-type doped region 191 and a P-type doped region 192. The P-type doped regions 191 and 192 are disposed in the P-type wells 151 and 152 respectively.

Referring to FIG. 1, the protection component 110 has a symmetrical structure. Furthermore, for the symmetrical structure, the protection component 110 has a first connection terminal TM1, a second connection terminal TM2, a first control terminal CT1, a second control terminal CT2, and a third control terminal CT3. Wherein, the first control terminal CT1 is electrically connected to a first drain/source of the N-type transistor MN1 and a first drain/source of the N-type transistor MN2. The first connection terminal TM1 is electrically connected to a second drain/source of the N-type transistor MN1 and the P-type doped region 191. The second connection terminal TM2 is electrically connected to a second drain/source of the N-type transistor MN2 and the P-type doped region 192. The second control terminal CT2 is electrically connected to a gate of the N-type transistor MN1. The third control terminal CT3 is electrically connected to the gate of the N-type transistor MN2.

The P-type well 151, the N-type deep well 140, the P-type well 152, and the N-type doped region 173 in the protection component 110 forms a PNPN structure, and the P-type well 152, the N-type deep well 140, the P-type well 151, and the N-type doped region 172 in the protection component 110 forms another PNPN structure. In other words, the protection component 110 is equivalent to a dual direction Silicon Controlled Rectifier (dual direction SCR), and the first connection terminal TM1 and the second connection terminal TM2 are equivalent to the two input terminals of the dual direction SCR. Furthermore, during the operation of the protection component 110, the conductive state of the N-type transistors MN1 and MN2 of the protection component 110 are controlled by the first to the third control terminals CT1~CT3. This increases the turn-on speed or suppresses the formation of the current path of the protection component 110.

Therefore, in the practical application, the protection component 110 can be, for example, applied to the ESD protection device showing in the FIG. 1. However the disclosure is not limited thereto. The operation mechanism of the protection component 110 and the component controller 120 are further described below in order to allow those having ordinary knowledge in the art to better understand the exemplary embodiment in the FIG. 1. Referring to FIG. 1 the component controller 120 includes a select circuit 121 and a control circuit 122. Furthermore, the select circuit 121 includes a plurality of P-type transistors MP1~MP4. The control circuit 122 includes a capacitor C1, a capacitor C2, a resistor R1 and a resistor R2.

In view of the circuit architecture of the select circuit 121, the P-type transistors MP1 and MP2 are connected in series between the second pad 102 and the first control terminal CT1. Namely, a second drain/source of the P-type transistor MP1 is electrically connected to the second pad 102, a second drain/source of the P-type transistor MP2 is electrically connected to a first drain/source of the P-type transistor MP1, and a first drain/source of the P-type transistor MP2 is electrically connected to the first control terminal CT 1. Furthermore, gates of the P-type transistors MP1 and MP2 are electrically connected to the first pad 101. On other hand, the P-type transistors MP3 and MP4 are connected in series between the first pad 101 and the first control terminal CT1. Namely, a second drain/source of the P-type transistor MP3 is electrically connected to the first pad 101, a second drain/source of P-type transistor MP4 is electrically connected to a first drain/source of the P-type transistor MP3, and a first drain/source of the P-type transistor MP4 is electrically connected to the first control terminal CT1. Furthermore, gates of the P-type transistor MP3 and MP4 are electrically connected to the second pad 102.

In operation, when the gate of the P-type transistor receives a low level signal, the P-type transistor is turned on. Therefore, when the signal level from the first pad 101 is lower, i.e. when two pads 101 and 102 receive a low level signal and a high level signal respectively, the P-type transistors MP1 and MP2 connected in series will be turned on, thus resulting in the select circuit 121 outputs the high level signal from the second pad 102. In contrast, when the signal level from the first pad 101 is higher, i.e. when the pads 101 and 102 receive the high level signal and the low level signal respectively, the P-type transistors MP3 and MP4 will be turned on, thus resulting in the select circuit 121 outputs the high level signal from the first pad 101. In other words, the select circuit 121 selects the signal that has higher level (that is, the high level signal) among signals coming from the pads 101 and 102, and then outputs the selected high level signal.

In view of the circuit architecture of the control circuit 122, the capacitor C1 and the resistor R1 are connected in series between the first pad 101 and second pad 102, and a connection point between the capacitor C1 and resistor R1 is electrically connected to the third control terminal CT3. Namely, a first terminal of the capacitor C1 is electrically connected to the first pad 101 and a second terminal of the capacitor C1 is electrically connected to the third control terminal CT3. A first terminal of the resistor R1 is electrically connected to the second terminal of the capacitor C1 and a second terminal of the resistor R1 is electrically connected to the second pad 102. On other hand, the capacitor C2 and resistor R2 are connected in series between the second pad 102 and the first pad 101, and a connection point between the capacitor C2 and resistor R2 is electrically connected to the second terminal CT2. Namely, a first terminal of the capacitor C2 is electrically connected to the second pad 102 and a second terminal of the capacitor C2 is electrically connected to the second control terminal CT2. A first terminal of the resistor R2 is electrically connected to the second terminal of the capacitor C2 and a second terminal of the resistor R2 is electrically connected to the first pad 101.

In operation, the capacitor and resistor connected in series can be utilized as a low pass filter or high pass filter. Therefore, if the voltage level of the second pad 102 is close to a system reference potential (i.e. a ground voltage) while the signal from the first pad 101 is a high frequency signal (i.e. an electrostatic pulse), the high frequency signal is transmitted to the third control terminal CT3 through the current loop formed by the capacitor C1 and resistor R1 to increase the voltage level of the third control terminal CT3. Furthermore, the voltage level of the second control terminal CT2 may be pulled down to the ground voltage by the current loop formed by the resistor R2 and capacitor C2. In contrast, if the signal from the first pad 101 is a low frequency signal (i.e. positive/negative input signal), the low frequency signal can be transmitted to the second control terminal CT2 by the current loop formed by the resistor R2 and capacitor C2 to adjust the voltage level of the second control terminal CT2. At this point, the voltage level of the third control terminal CT3 is adjusted to the ground voltage by the current loop formed by the capacitor C1 and resistor R1. In other words, the control circuit 122 adjusts the voltage levels of the second control terminal CT2 and the third control terminal CT3 according to the frequencies of the signals from the pads 101 and 102.

In the practical application, the ESD protection device is mainly used to guide the electrostatic pulses from the pads and to avoid damages on the integrated circuit (not shown) due to the electrostatic pulses. Furthermore, when the integrated circuit is in a normal operation, the integrated circuit is able to receive a positive input signal or a negative input signal through the pads, and the ESD protection device turns off the internal current path to avoid the leakage current. In other words, for the ESD protection device of the exemplary embodiment in the FIG. 1, under different conditions, the ESD protection device may receive the electrostatic pulses, the positive input signal, or the negative input signal from the pads. Therefore, the ESD protection device in the FIG. 1 is further explained below for the 3 conditions previously mentioned.

Figure 2:
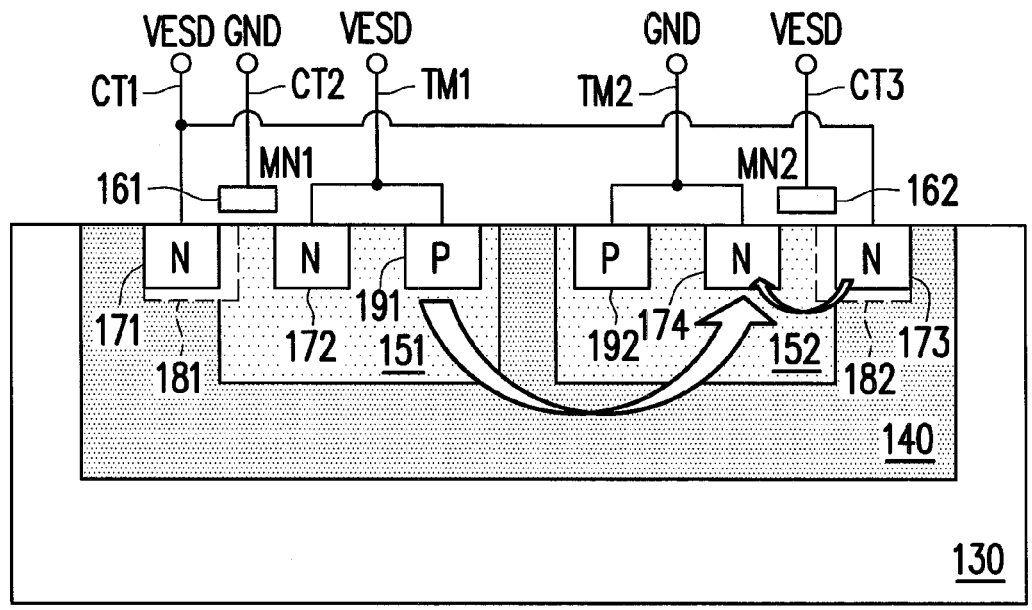
FIG. 2 is a diagram illustrating a condition of the protection component in FIG. 1 in the event of the ESD.

FIG. 2 is a diagram illustrating a condition where the protection component of FIG. 1 in the event of the ESD. Referring to FIGS. 1 and 2, in the occurrences of the electrostatic pulse VESD at the first pad 101, at this point the signal received by the first pad 101 is equivalent to a high level signal (i.e. electrostatic pulses VESD) and the voltage level of the second pad 102 is close to a ground voltage GND. Therefore, when the electrostatic pulse VESD occurs at the first pad 101, the select circuit 121 outputs the high level signal composed by the electrostatic pulse VESD to the first control terminal CT1.

Furthermore, the electrostatic pulse VESD is a high frequency signal, therefore, the control circuit 122 outputs the electrostatic pulse VESD to the third control terminal CT3 and pulls down the voltage level of the second control terminal CT2 to the ground voltage GND. Accordingly, as showing in the FIG. 2, the N-type transistor MN1 of the protection component 110 is turned off and the N-type transistor MN2 is turned on. At this point, as the N-type transistor MN2 is turned on, the P-type well 152 and the N-type doped region 174 is biased in forward-bias. As a result, the PNPN structure formed by the P-type well 151, the N-type deep well 140, the P-type well 152, and the N-type doped region 174 can be turned on quickly and forms a current path. In other words, if the electrostatic discharge event occurs, the component controller 120 turns on an N-type transistor of the protection component 110 to cause the protection component 110 to turn on quickly and forms the current path to discharge the electrostatic pulse.

Figure 3:
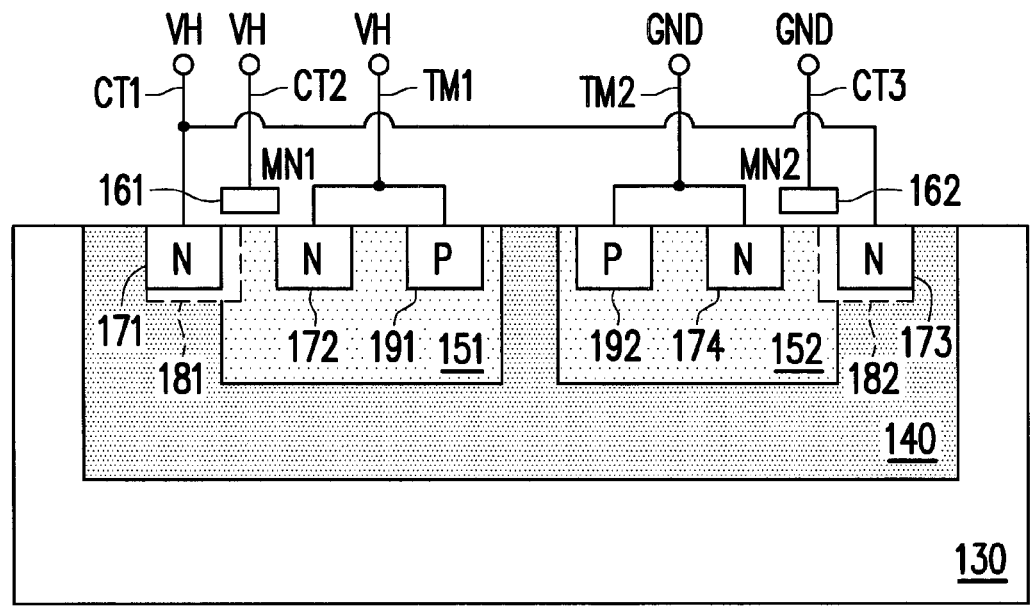
FIG. 3 is a diagram illustrating a condition of the protection component when the integrated circuit is in a normal operation of the integrated circuit.

FIG. 3 is a diagram illustrating a condition of the protection component during the normal operation of the integrated circuit. Referring to FIGS. 1 and 3, when the integrated circuit is in the normal operation, two operating signals which are transmitted to the pads 101 and 102 may be, for example, a positive input signal VH (i.e. 10 volt) and the system reference potential (i.e. the ground voltage GND). At this point, the signal received by the first pad 101 is equivalent to a high level signal (i.e. the positive input signal VH), and the signal received by the first pad 102 is equivalent to a low level signal (i.e. the ground voltage GND). Therefore, the select circuit 121 outputs the high level signal formed by the positive input signal VH to the first control terminal CT1.

On the other hand, the positive input signal VH is a low frequency signal, so the control circuit 122 transmits the positive input signal VH to the second control terminal CT2 and adjusts the voltage level of the third terminal CT3 to the ground voltage GND. Furthermore, the first connection terminal TM1 and the second connection terminal TM2 respectively receive the positive input signal VH and the ground voltage GND. Accordingly, as showing in FIG. 3, two N-type transistors MN1 and MN2 of the protection component are both in a turn-off state so that the protection component 110 is incapable of generating the current path.

In other words, when the integrated circuit is in the normal operation, i.e. when two operating signals are provided to two pads 101 and 102 respectively, the component controller 120 turns off two N-type transistors MN1 and MN2 of the protection component 110 according to the two operating signals previously mentioned, thus results in preventing the protection component 110 from forming the current path. At this point, the N-type deep well 140 is biased in a high level to cause a parasitic diode formed by the N-type deep well 140 and the P-type substrate 130 of the protection component 110 to bias in reverse-bias. As a result, the turn-off state of the protection component 110 may be further ensured.

Figure 4:
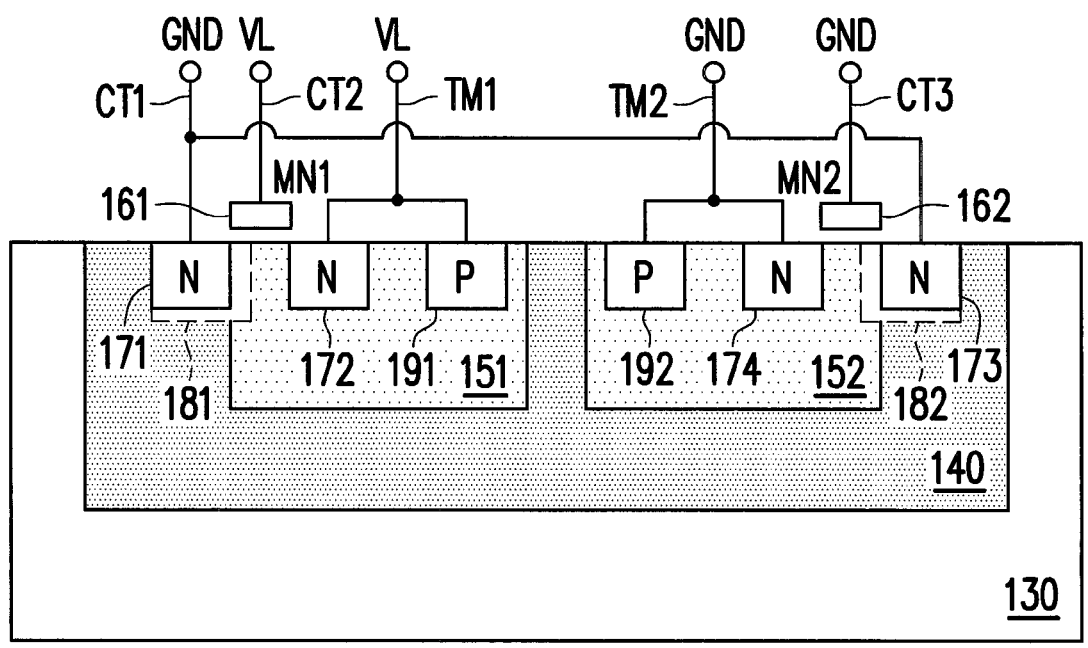
FIG. 4 is a diagram illustrating another state of the protection component of FIG. 1 when the integrated circuit is in the normal operation.

FIG. 4 is a diagram illustrating another state of the protection component of FIG. 1 when the integrated circuit is in the normal. Referring to the FIG. 1 and FIG. 4, when the integrated circuit is in the normal operation, two operating signals which is transmitted to the pads 101 and 102 may be, for example, a negative input signal VL (i.e. −10 volt) and the system reference potential (i.e. the ground voltage GND). At this point, the signal received by the first pad is equivalent to a low level signal (i.e. the negative input signal VL), and the signal received by the first pad 102 is equivalent to a high level signal (i.e. the ground voltage GND). Therefore, the select circuit 121 outputs the high level signal composed by the ground voltage GND to the first control terminal CT 1.

On the other hand, the negative input signal VL is a low frequency signal, so the control circuit 122 transmits the negative input signal VL to the second control terminal CT2 and adjusts the voltage level of the third terminal CT3 to the ground voltage GND. Furthermore, the first connection terminal TM1 and the second connection terminal TM2 respectively receive the negative input signal VL and the ground voltage GND. Accordingly, as showing in FIG. 4, two N-type transistors MN1 and MN2 of the protection component 110 are both in turn off state so that the protection component 110 is incapable of generating the current path. In other words, when the integrated circuit is in the normal operation, even if the integrated circuit receives the negative input signal through the pads, the component controller 120 turns off two N-type transistors MN1 and MN2 of the protection component 110, thus causes the protection component 110 to be unable to form the current path. At this point, the parasitic diode formed by the N-type deep well 140 and the P-type substrate 130 is biased in reverse-bias to ensure that the protection component 110 is in turn-off state.

Figure 5:
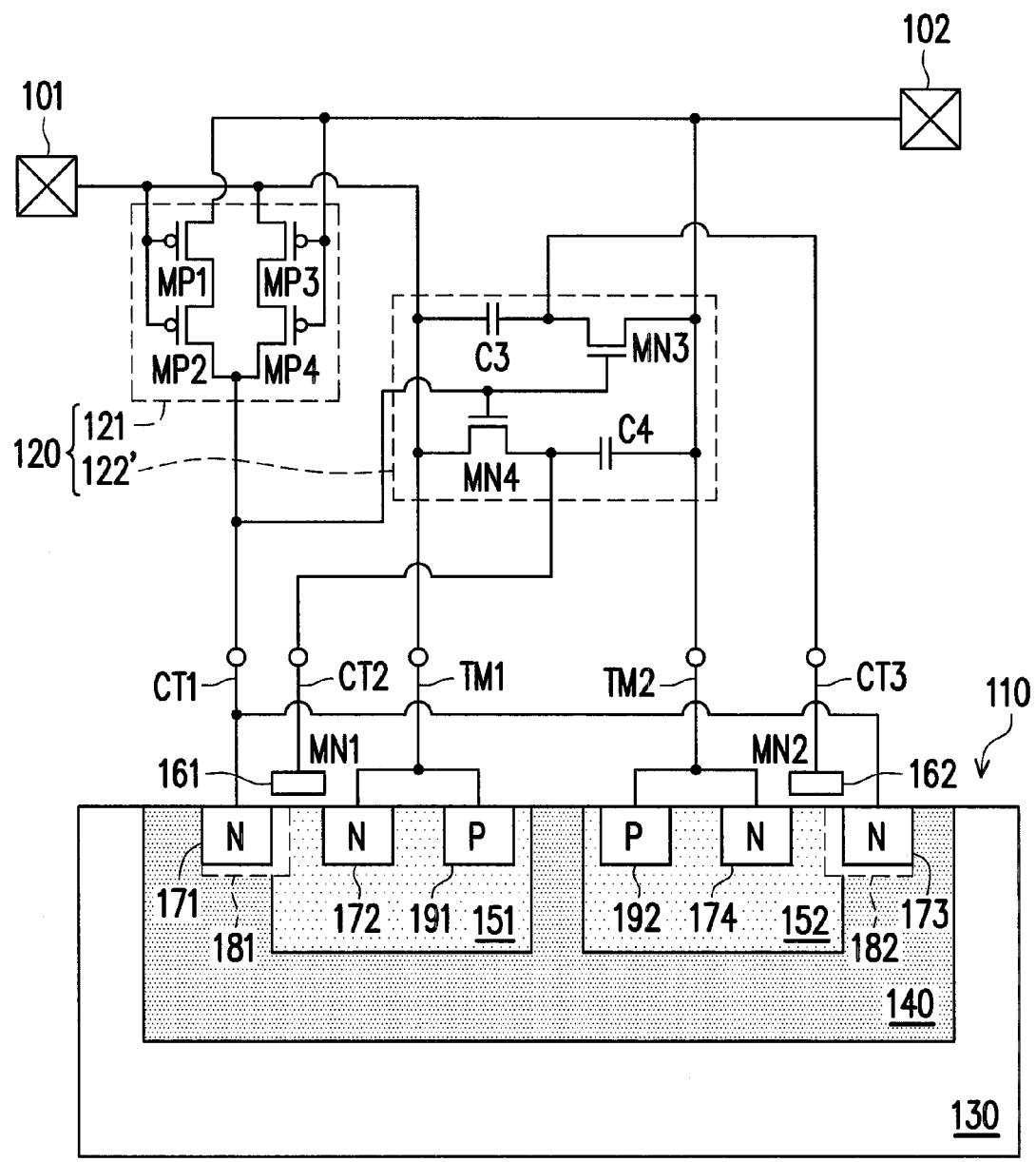
FIG. 5 is a schematic diagram of an ESD protection device according to another embodiment of the disclosure.

FIG. 5 is a schematic diagram of an ESD protection device according to another embodiment of the disclosure. Referring to FIG. 1 and FIG. 5, a main difference between two exemplary embodiments is that the control circuit 122 of the embodiment in the FIG. 1 is composed of two capacitors C1 and C2 and two resistors R1 and R2, and the control circuit 122' of the embodiment in the FIG. 5 is composed of two capacitors C3 and C4 and two N-type transistors MN3 and MN4.

In view of the control circuit 122' of the embodiment in the FIG. 5, a first terminal of the capacitor C3 is electrically connected to the first pad 101 and a second terminal of the capacitor C3 is electrically connected to the third control terminal CT3. A first drain/source of the transistor MN3 is electrically connected to the second terminal of the capacitor C3, a gate of the N-type transistor MN3 is electrically connected to the select circuit 121, and a second drain/source of the N-type transistor MN3 is electrically connected to the second pad 102. A first terminal of the capacitor C4 is electrically connected to the second pad 102 and a second terminal of the capacitor C4 is electrically connected to the second control terminal CT2. A first drain/source of the N-type transistor MN4 is electrically connected the second terminal of the capacitor C4, a gate of the N-type transistor MN4 is electrically connected to the select circuit 121, and a second drain/source of the N-type transistor MN4 is electrically connected to the first pad 101.

In operation, the select circuit 121 transmits the high level signal to the gates of the N-type transistor MN3 and MN4 to bias the N-type transistors MN3 and MN4 in the linear region. As a result, the N-type transistors MN3 and MN4 are in turn-on state, and have the characteristics of the linear resistor. In other words, under the control of the select circuit 121, the N-type transistors MN3 and MN4 is equivalent to two resistors R1 and R2 of the control circuit 122 in the FIG. 1. Accordingly, the control circuit 122' in the FIG. 5 has an identical or a similar operating mechanism as the control circuit 122 in the FIG. 1.

For example, when the electrostatic pulse occurs at the first pad 101, the select circuit 121 uses the high level signal composed by the electrostatic pulse to turn on the N-type transistors MN3 and MN4 and to bias the N-type transistor MN3 and MN4 in the linear region. Accordingly, the electrostatic pulse from the first pad 101 is transmitted to the third control terminal CT3 through the current loop formed by the capacitor C3 and the N-type transistor MN3. Furthermore, the voltage level of the second control terminal CT2 is pulled down to the ground voltage through the current loop formed by the N-type transistor MN4 and the capacitor C4. The connections and the operating mechanisms of other components of the embodiment in the FIG. 5 has been described in the exemplary embodiment previously described, hence they are not been repeated here.

Figure 6:
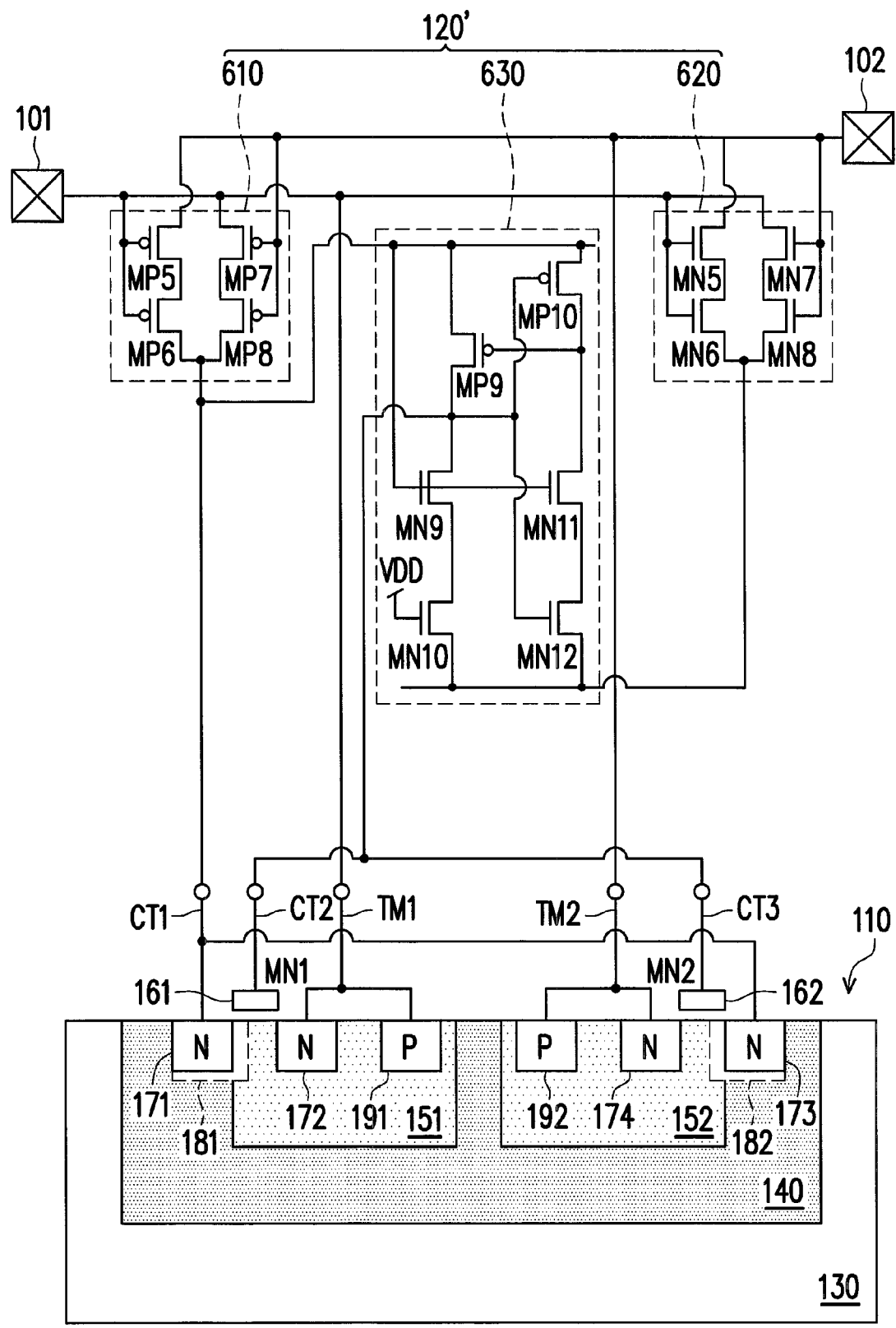
FIG. 6 is a diagram illustrating an ESD protection device according to other one embodiment of the disclosure

FIG. 6 is a diagram illustrating an ESD protection device according to other one embodiment of the disclosure. Referring to FIGS. 1 and 6, a main difference between two exemplary embodiments is that the component controller 120' in the FIG. 6 and the component controller 120 in the FIG. 1 are different in circuit architecture, however, the operating mechanisms of both embodiments are identical or similar.

In view of the component controller 120' in the FIG. 6, the component controller 120' has a select circuit 610, a select circuit 620, and a control circuit 630.

Wherein in the select circuit 610 has P-type transistors MP5~MP8 and has identical circuit structure with the select circuit 121 in FIG. 1. In other words, the select circuit 610 selects the signal that is high level (also referred to as high level signal) among the signals from two pads 101 and 102, and then outputs the selected high level signal accordingly. The detail descriptions of the select circuit 610 are included in the exemplary embodiment previously described, hence they are not been repeated here.

The select circuit 620 includes N-type transistor MN5~MN 8. Wherein, a first drain/source of the N-type transistor MN5 is electrically connected to the second pad 102, a gate of the N-type transistor MN5 is electrically connected to the first pad 101. A first drain/source of the N-type transistor MN6 is electrically connected to a second drain/source of the N-type transistor MN5, a gate of the N-type transistor MN6 is electrically connected to the first pad 101, and a second drain/source of the N-type transistor MN6 is electrically connected to the control circuit 630. A first drain/source of the N-type transistor MN7 is electrically connected to the first pad 101, a gate of the N-type transistor MN7 is electrically connected to the second pad 102. A first drain/source of the N-type transistor MN8 is electrically connected to a second drain/source of the N-type transistor MN7, a gate of the N-type transistor MN8 is electrically connected to the second pad 102, and a second drain/source of the N-type transistor MN8 is electrically connected to the control circuit 630.

In operation, when the gate of the N-type transistor receives a high level signal, the N-type transistor is turned on. Therefore, when the signal level from the first pad 101 is lower, i.e. when two pads 101 and 102 receive a low level signal and a high level signal respectively, the N-type transistors MP7 and MP8 connected in series will be turned on, thus resulting in the select circuit 620 outputs the low level signal from the first pad 101. In contrast, when the signal level from the first pad 101 is higher, i.e. when the pads 101 and 102 receive the high level signal and the low level signal respectively, the N-type transistors MP5 and MP6 connected in series will be turned on, thus resulting in the select circuit 620 outputs the low level signal from the second pad 102. In other words, the select circuit 620 selects the signal that has lower level (that is, the low level signal) among the signals from the pads 101 and 102, and then outputs the selected low level signal.

The control circuit 630 includes P-type transistors MP9 and MP10 and N-type transistors MN9~MN 12. Wherein, a second drain/source of the P-type transistor MP9 is electrically connected to the select circuit 610 and a first drain/source of the P-type transistor MP9 is electrically connected to the second control terminal CT2 and the third control terminal CT3. A first drain/source of the N-type transistor MN9 is electrically connected to a first drain/source of the P-type transistor MP9 and a gate of the N-type transistor MN9 is electrically connected to the select circuit 610. A first drain/source of the N-type transistor MN10 is electrically connected to a second drain/source of the N-type transistor MN9, a gate of the N-type transistor MN10 receives the power voltage VDD, and a second drain/source of the N-type transistor MN10 is electrically connected to the select circuit 620. A second drain/source of the P-type transistor MP10 is electrically connected to the select circuit 610, a gate of the P-type transistor MP10 is electrically connected to the first drain/source of the P-type transistor MP9, and a first drain/source of the P-type transistor MP10 is electrically connected to the gate of the P-type transistor MP9. A first drain/source of the N-type transistor MN11 is electrically connected to the first drain/source of the P-type transistor MP10, and a gate of the N-type transistor MN11 is electrically connected to the select circuit 610. A first drain/source of the N-type transistor MN12 is electrically connected to a second drain/source of the N-type transistor MN11, a gate of the N-type transistor MN12 is electrically connected to the gate of the P-type transistor MP10, and a second drain/source of the N-type transistor MN12 is electrically connected to the select circuit 620.

Similarly, to the ESD protection device of the exemplary embodiment in the FIG. 6, under different conditions, it may receive an electrostatic pulse, a positive input signal, or a negative input signal from the pads. Therefore, the ESD protection device in the FIG. 6 is further described according to these three conditions previously mentioned.

Figure 7:
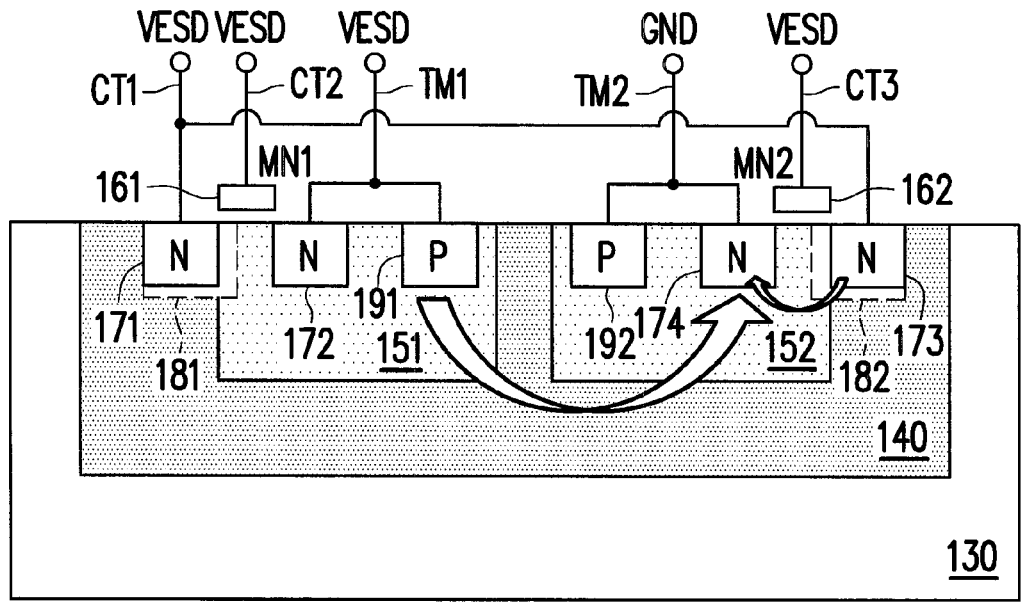
FIG. 7 is a diagram illustrating a condition of the protection component in the FIG. 6 in the event of the ESD

FIG. 7 is a diagram illustrating a condition where the protection component of the FIG. 6 in the event of the ESD. Referring to the FIGS. 6 and 7, in the occurrences of the electrostatic pulse VESD at the first pad 101, at this point the signal received by the first pad 101 is equivalent to a high level signal (i.e. the electrostatic pulses VESD), and the voltage level of the second pad 102 is close to a ground voltage GND. Therefore, the select circuit 610 outputs the high level signal composed by the electrostatic pulse VESD to the first control terminal CT1 and the control circuit 630. Furthermore, the select circuit 620 outputs the low level signal which is close to the ground voltage GND to the control circuit 630.

In view of the control circuit 630, the control circuit 630 is unable to receive the power voltage VDD at this point, thus resulting in the N-type transistor MN10 is turned off. Furthermore, the electrostatic pulse VESD from the select circuit 610 turns on the N-type transistors MN9 and MN11. The electrostatic pulse VESD is coupled to the gate of the P-type transistor MP10 through a parasitic capacitance of the P-type transistor MP10, thus turns off the P-type transistor MP10 and turns on the N-type transistor MN12. As the N-type transistors MN11 and MN12 are turned on, the gate of the P-type transistor MP9 receives the low level signal to turn on the P-type transistor MP9. As a result, the control circuit 630 outputs the electrostatic pulse VESD to the second control terminal CT2 and the third control terminal CT3 through the P-type transistor MP9 that is turned on. In other words, in the occurrence of the electrostatic VESD at the first pad 101, the control circuit 630 outputs the high level signal composed by the electrostatic pulse VESD to the second control terminal CT2 and the third control terminal CT 3.

Accordingly, as showing in FIG. 7, the N-type transistor MN1 of the protection component 110 is turned off, and the N-type transistor MN2 is turned on. At this point, as the N-type transistor MN2 is turned on, the P-type well 152 and N-type doped region 174 is biased in forward-bias. As a result, the PNPN structure composed by the P-type well 151, the N-type deep well 140, the P-type well 152, and the N-type doped region 174 can be turned on quickly and forms a current path. In other words, if the electrostatic discharge event occurs, the component controller 630 turns on an N-type transistor of the protection component 110 to cause the protection component 110 to turn on quickly, and forms the current path to discharge the electrostatic pulse.

Figure 8:
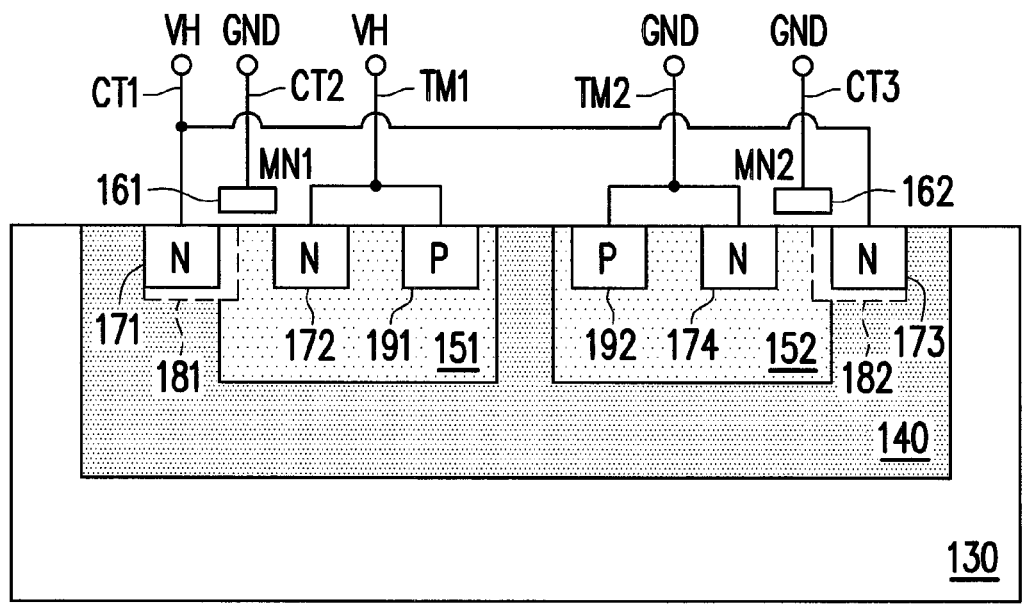
FIG. 8 is a diagram illustrating a condition of the protection component when the integrated circuit is in the normal operation.

FIG. 8 is a diagram illustrating a condition of the protection component when the integrated circuit is in the normal operation. Referring to the FIGS. 6 and 8, when the integrated circuit is in the normal operation, two operating signals transmitted to the pads 101 and 102 may be, for example, a positive input signal VH (i.e. 10 volt) and the system reference potential (i.e. the ground voltage GND), and the control circuit 630 is able to receive the power voltage VDD. At this point, the signal received by the first pad 101 is equivalent to the high level signal (i.e. the positive input signal VH), and the signal received by the first pad 102 is equivalent to the low level signal (i.e. the ground voltage GND). Therefore, the select circuit 610 outputs the high level signal composed by the positive input signal VH to the first control terminal CT1 and control circuit 630. Furthermore, the select circuit 620 outputs the low level signal composed by the ground voltage GND to the control circuit 630.

On the other hand, the control circuit 630 utilizes the power voltage VDD to turn on the N-type transistor MN10. Furthermore, the positive input signal VH from the select circuit 610 turns on the N-type transistors MN9 and MN11. Thus, as the N-type transistors MN9 and MN10 are turned on, the control circuit 630 outputs the low level signal composed by the ground voltage GND to the second control terminal CT2 and the third control terminal CT3. Furthermore, as the N-type transistors MN9 and MN10 are turned on, the gate of the P-type transistor MP10 receives the low level signal composed by the ground voltage GND and then the P-type transistor MP10 stays in the turn-on state to turn off the P-type transistor MP9.

As a result, as showing in FIG. 8, under the turn off state of two N-type transistors MN1 and MN2 of the protection component 110, the protection component 110 is incapable of generating the current path. In other words, when the integrated circuit is in the normal operation, i.e. when two operating signals are supplied to two pads 101 and 102, the component controller 630 turns off two N-type transistors MN1 and MN2 of the protection component 110 according to two operating signals to cause the protection component to be incapable of generating the current path. Furthermore, the parasitic diode formed by the N-type deep well 140 and P-type substrate 130 will be biased in reverse-bias.

Figure 9:
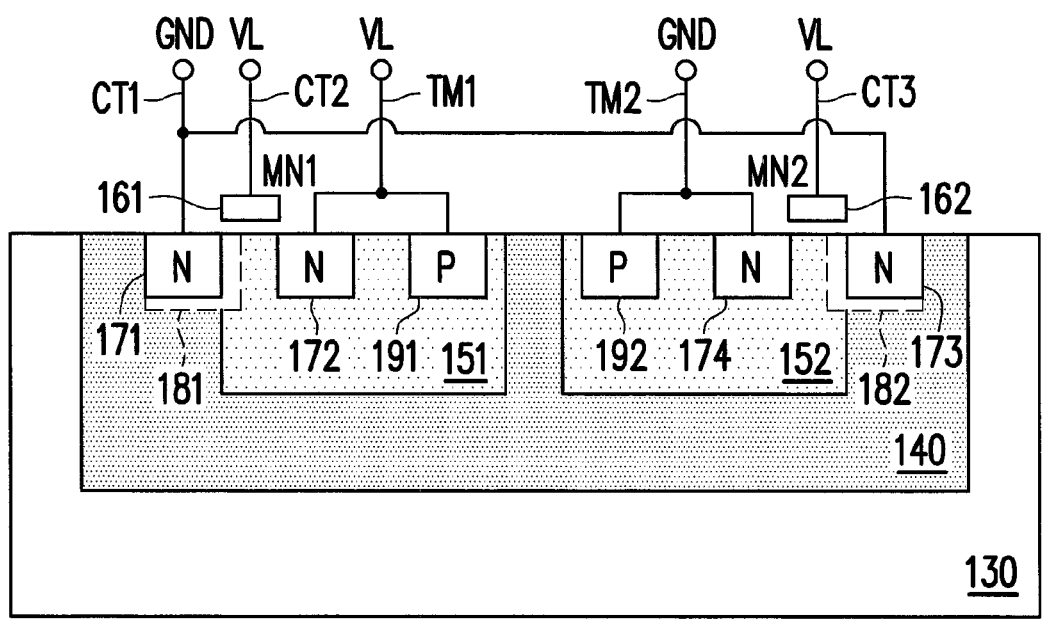
FIG. 9 is a diagram illustrating another condition of the protection components in the FIG. 6 when the integrated circuit is in the normal operation.

FIG. 9 is a diagram illustrating another condition of the protection components in the FIG. 6 when the integrated circuit is in the normal operation. Referring to FIGS. 6 and 9, when the integrated circuit is in the normal operation, two operating signals which is transmitted to the pads 101 and 102 may be, for example, a negative input signal VL (i.e. −10 volt) and the system reference potential (i.e. the ground voltage GND), and the control circuit 630 is able to receive the power voltage VDD. At this point, the signal received by the first pad 101 is equivalent to a low level signal (i.e. the negative input signal VL), and the signal received by the first pad 102 is equivalent to a high level signal (i.e. the ground voltage GND). Therefore, the select circuit 610 outputs the high level signal composed by the ground voltage GND to the first control terminal CT1 and the control circuit 630. Furthermore, the select circuit 620 outputs the low level signal composed by the negative input signal VL to the control circuit 630.

On the other hand, the control circuit 630 utilizes the power voltage VDD to turn on the N-type transistor MN10. Furthermore, the ground voltage GND from the select circuit 610 turns on the N-type transistors MN9 and MN11. Thus, as the N-type transistors MN9 and MN10 are turned on, the control circuit 630 outputs the low level signal composed by the negative input signal VL to the second control terminal CT2 and the third control terminal CT3. Furthermore, as the N-type transistors MN9 and MN10 are turned on, the gate of the P-type transistor MP10 receives a low level signal composed by the negative signal VL and then the P-type transistor MP10 stays in the turn-on state to turn off the P-type transistor MP9.

As a result, as showing in FIG. 9, under the off state of two N-type transistors MN1 and MN2 of the protection component 110, this causes the protection component 110 to be incapable of generating the current path. In other words, when the integrated circuit is in the normal operation, even if the negative input signal is received through the pads, the component controller 630 turns off two N-type transistors MN1 and MN2 of the protection component 110, thus causes the protection component 110 to be incapable of generating the current path. At this point, the parasitic diode formed by the N-type deep well 140 and the P-type substrate 130 is biased in reverse-bias in order to ensure that the protection component 110 is in turn off state.

In summary, the protection component besides having the dual direction trigger PNPN structure, it also has two N-type transistors. The on-off state of the N-type transistors in the protection component can be controlled by adjusting the voltage level of the control terminal of the protection component. The turn-on speed is enhanced or the forming of the current path of the protection component is avoided. Furthermore, the protection component has better turn-on speed, so the protection function of the ESD protection device is enhanced It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents

What is claimed is:

1. An electrostatic discharge (ESD) protection device, electrically connected to a first pad and a second pad, and comprising:

a protection component, having a first connection terminal, a second connection terminal, a first control terminal, a second control terminal, and a third control terminal, wherein the protection component is respectively and electrically connected to the first pad and the second pad through the first connection terminal and the second connection terminal, and comprises a P-type substrate, comprising an N-type deep well, a first P-type well, and a second P-type well, wherein the first P-type well and the second P-type well are disposed in the N-type deep well;

a first N-type transistor, formed in the N-type deep well and the first P-type well; and a second N-type transistor, formed in the N-type deep well and the second P-type well, wherein a first drain/source of the first N-type transistor and a first drain/source of the second N-type transistor are electrically connected to the first control terminal, a second drain/source of the first N-type transistor and a second drain/source of the second N-type transistor are respectively and electrically connected to the first connection terminal and the second connection terminal, gates of the first N-type transistor and the second N-type transistor are respectively and electrically connected to the second control terminal and the third control terminal; and a component controller, electrically connected to the first through the third control terminals, wherein when an electrostatic pulse occurs at the first pad or the second pad, the component controller turns on one of the first N-type transistor and the second N-type transistor to discharge the electrostatic pulse through a current path of the protection component, when a first operating signal and a second operating signal are supplied to the first pad and the second pad, the component controller turns off the first N-type transistor and the second N-type transistor according to the first operating signal and the second operating signal so that the protection component is incapable of generating the current path.

2. The ESD protection device as claimed in claim 1, wherein the electrostatic pulse occurs at the first pad, the component controller guides the electrostatic pulse to the first control terminal, and the component controller turns on the second N-type transistor, and turns off the first N-type transistor.

3. The ESD protection device as claimed in claim 2, wherein the component controller further guides the electrostatic pulse to the third control terminal and pulls down a voltage level of the second control terminal to a ground voltage.

4. The ESD protection device as claimed in claim 2, wherein the component controller further guides the electrostatic pulse to the second control terminal and the third control terminal.

5. The ESD protection device as claimed in claim 1, wherein, the component controller comprises:
 a first select circuit, electrically connected to the first pad, the second pad, and the first control terminal, wherein the first select circuit selects a high level signal among signals coming from the first pad and the second pad, and then outputs the high level signal to the first control terminal; and
 a first control circuit, electrically connected to the first pad, the second pad, the second control terminal, and the third control terminal, wherein the first control circuit adjusts voltage levels of the second control terminal and the third control terminal according to frequencies of the signals coming from the first pad and the second pad.

6. The ESD protection device as claimed in claim 5, wherein the first select circuit comprises:
 a first P-type transistor, wherein a gate of the first P-type transistor is electrically connected to the first pad;
 a second P-type transistor, wherein a gate of the second P-type transistor is electrically connected to the first pad, and the first P-type transistor and the second P-type transistor are electrically connected in series between the second pad and the first control terminal;
 a third P-type transistor, wherein a gate of the third P-type transistor is electrically connected to the second pad; and
 a fourth P-type transistor, wherein a gate of the fourth P-type transistor is electrically connected to the second pad, and the third P-type transistor and the fourth P-type transistor are electrically connected in series between the first pad and the first control terminal.

7. The ESD protection device as claimed in claim 5, wherein the first control circuit comprises:
 a first capacitor, having a first terminal electrically connected to the first pad and a second terminal electrically connected to the third control terminal;
 a first resistor, having a first terminal electrically connected to the second terminal of the first capacitor and a second terminal electrically connected to the second pad;
 a second capacitor, having a first terminal electrically connected to the second pad and a second terminal electrically connected to the second control terminal; and
 a second resistor, having a first terminal electrically connected to the second terminal of the second capacitor and a second terminal electrically connected to the first pad.

8. The ESD protection device as claimed in claim 5, wherein the first control circuit comprises:
 a third capacitor, having a first terminal electrically connected to the first pad and a second terminal electrically connected to the third control terminal, a third N-type transistor, having a first drain/source electrically connected to the second terminal of the third capacitor, a gate electrically connected to the first select circuit, and a second drain/source electrically connected to the second pad;
 a fourth capacitor, having a first terminal electrically connected to the second pad and a second terminal electrically connected to the second control terminal; and
 a fourth N-type transistor, having a first drain/source electrically connected the second terminal of the fourth capacitor, a gate electrically connected to the first select circuit, and a second drain/source electrically connected to the first pad.

9. The ESD protection device as claimed in claim 1, wherein the component controller comprises:
 a second select circuit, electrically connected to the first pad, the second pad, and the first control terminal, wherein the second select circuit selects a high level signal among signals coming from the first pad and the second pad, and then outputs the high level signal to the first control terminal;
 a third select circuit, electrically connected to the first pad and the second pad, wherein the third select circuit selects a low level signal among the signals coming from the first pad and the second pad, and then outputs the low level signal; and
 a second control circuit, electrically connected to the second select circuit, the third select circuit, the second control terminal, and the third control terminal, wherein when the electrostatic pulse occurs at the first pad, the second control circuit outputs the high level signal formed by the electrostatic pulse to the second control terminal and the third control terminal, when the first operating signal and the second operating signal are supplied to the first pad and the second pad, the second control circuit receives a power voltage and outputs the low level signal to the second control terminal and third control terminal.

10. The ESD protection device as claimed in claim 9, wherein the second select circuit comprises:
 a fifth P-type transistor, wherein a gate of the fifth P-type transistor is electrically connected to the first pad;
 a sixth P-type transistor, wherein a gate of the sixth P-type transistor is electrically connected to the first pad, and the fifth P-type transistor and the sixth P-type transistor are electrically connected in series between the second pad and the first control terminal;
 a seventh P-type transistor, wherein a gate of the seventh P-type transistor is electrically connected to the second pad; and
 a eighth P-type transistor, wherein a gate of the eighth P-type transistor is electrically connected to the second pad, and the seventh P-type transistor and the eighth P-type transistor are electrically connected in series between the first pad and the first control terminal.

11. The ESD protection device as claimed in claim 9, wherein the third select circuit comprises:
 a fifth N-type transistor, having a first drain/source electrically connected to the second pad and a gate electrically connected to the first pad;
 a sixth N-type transistor, having a first drain/source electrically connected to the second drain/source of the fifth N-type transistor, a gate electrically connected to the first pad, and a second drain/source electrically connected to the second control circuit;
 a seventh N-type transistor, having a first drain/source electrically connected to the first pad and a gate electrically connected to the second pad; and a eighth N-type transistor, having a first drain/source electrically connected to the second drain/source of the seventh N-type transistor, a gate electrically connected to the second pad, and a second drain/source electrically connected to the second control circuit.

12. The ESD protection device as claimed in claim 9, wherein the second control circuit comprises:
a ninth P-type transistor, having a first drain/source electrically connected to the second control terminal and the third control terminal and a second drain/source electrically connected to the second select circuit;
a ninth N-type transistor, having a first drain/source electrically connected to the first drain/source of the ninth P-type transistor and a gate electrically connected to the second select circuit;
a tenth N-type transistor, having a first drain/source electrically connected to the second drain/source of the ninth N-type transistor, a gate receiving the power voltage, and a second drain/source electrically connected to the third select circuit;
a tenth P-type transistor, having a first drain/source electrically connected to the gate of the ninth P-type transistor, a gate electrically connected to the first drain/source of the ninth N-type transistor, and a second drain/source electrically connected to the second select circuit;
a eleventh N-type transistor, having a first drain/source electrically connected to the first drain/source of the tenth P-type transistor and a gate electrically connected to the second select circuit; and
a twelfth N-type transistor, having a first drain/source electrically connected to the second drain/source of the eleventh N-type transistor, a gate electrically connected to the gate of the tenth P-type transistor, and a second drain/source electrically connected to the third select circuit.

13. The ESD protection device as claimed in claim 1, wherein the first N-type transistor comprises:
a first gate structure, disposed on the first P-type well, wherein a gate of the first N-type transistor is formed by the first gate structure;
a first N-type doped region, disposed in the N-type deep well and adjacent to the first P-type well, wherein a first drain/source of the first N-type transistor is formed by the first N-type doped region; and
a second N-type doped region, disposed in the first P-type well, wherein a second drain/source of the first N-type transistor is formed by the second N-type doped region.

14. The ESD protection device as claimed in claim 13, wherein the first N-type transistor further comprises:
a first N-type lightly doped region, disposed in the first P-type well which is below the first gate structure, and surrounding the first N-type doped region.

15. The ESD protection device as claimed in claim 1, wherein the second N-type transistor comprises:
a second gate structure, disposed on the second P-type well, wherein a gate of the second N-type transistor is formed by the second gate structure;
a third N-type doped region, disposed in the N-type deep well and adjacent to the second P-type well, wherein a first drain/source of the second N-type transistor is formed by the third N-type doped region; and
a fourth N-type doped region, disposed in the second P-type well, wherein a second drain/source of the second N-type transistor is formed by the fourth N-type doped region.

16. The ESD protection device as claimed in claim 15, wherein the second N-type transistor further comprises:

a second N-type lightly doped region, disposed in the second P-type well which is below the second gate structure and surrounding the third N-type doped region.

17. The ESD protection device as claimed in claim 1, wherein the protection component further comprises:
a first P-type doped region, disposed in the first P-type well and electrically connected to the first connection terminal.

18. The ESD protection device as claimed in claim 1, wherein the protection component further comprises:
a second P-type doped region, disposed in the second P-type well and electrically connected to the second connection terminal 19. A protection component, comprising:
a P-type substrate, comprising an N-type deep well, a first P-type well, and a second P-type well, wherein the first P-type well and the second P-type well are disposed in the N-type deep well;
a first N-type transistor, formed in the N-type deep well and the first P-type well; and
a second N-type transistor, formed in the N-type deep well and the second P-type well, wherein the protection component has a first connection terminal, a second connection terminal, a first control terminal, a second control terminal and a third control terminal, a first drain/source of the first N-type transistor and a first drain/source of the second N-type transistor are electrically connected to the first control terminal, a second drain/source of the first N-type transistor and a second drain/source of the second N-type transistor are respectively and electrically connected to the first connection terminal and the second connection terminal, and gates of the first N-type transistor and the second N-type transistor are respectively and electrically connected to the second control terminal and the third control terminal.

20. The protection component as claimed in claim 19, further comprising:
a first P-type doped region, disposed in the first P-type well and electrically connected to the first connection terminal.

21. The protection component as claimed in claim 19, further comprising:
a second P-type doped region, disposed in the second P-type well and electrically connected to the second connection terminal 22. The protection component as claimed in claim 19, wherein the first N-type transistor comprises:
a first gate structure, disposed on the first P-type well, wherein the gate of the first N-type transistor is formed by the first gate structure;
a first N-type doped region, disposed in the N-type deep well and adjacent to the first P-type well, wherein the first drain/source of the first N-type transistor is formed by the first N-type doped region; and
a second N-type doped region, disposed in the first P-type well, wherein the second drain/source of the first N-type transistor is formed by the second N-type doped region.

23. The protection component as claimed in claim 22, wherein the first N-type transistor further comprises:
a first N-type lightly doped region, disposed in the first P-type well which is below the first gate structure and surrounding to the first N-type doped region.

24. The protection component as claimed in claim 19, wherein the second N-type transistor comprises:
a second gate structure, disposed on the second P-type well, wherein the gate of the second N-type transistor is formed by the second gate structure;

a third N-type doped region, disposed in the N-type deep well and adjacent to the second P-type well, wherein the first drain/source of the second N-type transistor is formed by the third N-type doped region; and a fourth N-type doped region, disposed in the second P-type well, wherein the second drain/source of the second N-type transistor is formed by the fourth N-type doped region.

25. The protection component as claimed in claim 24, wherein the second N-type transistor further comprises:

a second N-type lightly doped region, disposed in the second P-type well which is below the second gate structure and surrounding to the third N-type doped region.

* * * * *